United States Patent
Choi et al.

(10) Patent No.: US 9,466,761 B2
(45) Date of Patent: Oct. 11, 2016

(54) LIGHT EMITTING DIODE HAVING WELL AND/OR BARRIER LAYERS WITH SUPERLATTICE STRUCTURE

(75) Inventors: Joo Won Choi, Ansan-si (KR); Dong Seon Lee, Ansan-si (KR); Gyu Beom Kim, Ansan-si (KR); Sang Joon Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 1734 days.

(21) Appl. No.: 12/057,842

(22) Filed: Mar. 28, 2008

(65) Prior Publication Data

US 2008/0237570 A1    Oct. 2, 2008

(30) Foreign Application Priority Data

Mar. 29, 2007  (KR) .................. 10-2007-0030872
Mar. 30, 2007  (KR) .................. 10-2007-0032010

(51) Int. Cl.

| | | |
|---|---|---|
| *H01L 29/06* | (2006.01) | |
| *H01L 31/00* | (2006.01) | |
| *H01L 33/06* | (2010.01) | |
| *B82Y 20/00* | (2011.01) | |
| *H01S 5/343* | (2006.01) | |
| *H01L 33/12* | (2010.01) | |
| *H01L 33/32* | (2010.01) | |

(52) U.S. Cl.
CPC .............. *H01L 33/06* (2013.01); *B82Y 20/00* (2013.01); *H01S 5/34333* (2013.01); *H01L 33/12* (2013.01); *H01L 33/32* (2013.01)

(58) Field of Classification Search
CPC ...................................................... H01L 33/06
USPC .......................................... 257/13, E33.034
See application file for complete search history.

(56) References Cited

U.S. PATENT DOCUMENTS

| | | |
|---|---|---|
| 6,040,588 A | 3/2000 | Koide et al. |
| 6,060,335 A | 5/2000 | Rennie et al. |
| 2003/0124789 A1 | 7/2003 | Koide et al. |
| 2004/0113169 A1 | 6/2004 | Asami et al. |
| 2004/0251471 A1 | 12/2004 | Dwilinski et al. |
| 2004/0256611 A1 | 12/2004 | Kim et al. |
| 2005/0179027 A1 | 8/2005 | Kim et al. |

(Continued)

FOREIGN PATENT DOCUMENTS

| | | |
|---|---|---|
| JP | 10-135514 | 5/1998 |
| JP | 10-289877 | 10/1998 |

(Continued)

OTHER PUBLICATIONS

Extended European Search Report dated Aug. 29, 2010.

(Continued)

*Primary Examiner* — Hsin-Yi Hsieh
(74) *Attorney, Agent, or Firm* — H.C. Park & Associates, PLC

(57) ABSTRACT

A light emitting diode (LED) having well and/or barrier layers with a superlattice structure is disclosed. An LED has an active region between an N-type GaN-based semiconductor compound layer and a P-type GaN-based semiconductor compound layer, wherein the active region comprises well and/or barrier layers with a superlattice structure. As the well and/or barrier layers with a superlattice structure are employed, it is possible to reduce occurrence of defects caused by lattice mismatch between the well layer and the barrier layer.

3 Claims, 3 Drawing Sheets

(56) References Cited

U.S. PATENT DOCUMENTS

| | | |
|---|---|---|
| 2006/0138431 A1 | 6/2006 | DWilinski et al. |
| 2007/0063207 A1 | 3/2007 | Tanizawa et al. |
| 2007/0145406 A1 | 6/2007 | Han et al. |
| 2008/0093610 A1 | 4/2008 | Lee |
| 2008/0251780 A1 | 10/2008 | Li et al. |
| 2008/0251781 A1 | 10/2008 | Han et al. |

FOREIGN PATENT DOCUMENTS

| | | |
|---|---|---|
| JP | 2003-218396 | 7/2003 |
| JP | 2005-259827 | 9/2005 |
| JP | 2006-086167 | 3/2006 |
| JP | 2007-157766 | 6/2007 |
| KR | 10-2004-0016723 | 2/2004 |
| KR | 10-0604406 | 7/2006 |
| WO | 00/30178 | 5/2000 |
| WO | 01-39282 | 5/2001 |
| WO | 02/097904 | 12/2002 |
| WO | 2005-101532 | 10/2005 |
| WO | 2006/022497 | 3/2006 |
| WO | 2008/082081 | 7/2008 |

OTHER PUBLICATIONS

Notice of Allowance of U.S. Appl. No. 12/517,314 issued on Oct. 27, 2011.

Final Office Action of U.S. Appl. No. 12/517,314 issued on Sep. 7, 2011.

Non-Final Office Action of U.S. Appl. No. 12/517,314 issued on Jun. 2, 2011.

Non-Final Office Action of U.S. Appl. No. 12/178,758 issued on Jul. 20, 2009.

Non-Final Office Action of U.S. Appl. No. 12/178,758 issued on Jan. 11, 2010.

Final Office Action of U.S. Appl. No. 12/178,758 issued on Jul. 23, 2010.

Non-Final Office Action of U.S. Appl. No. 12/178,758 issued on Nov. 12, 2010.

Final Office Action of U.S. Appl. No. 12/178,758 issued on Apr. 7, 2011.

Non-Final Office Action of U.S. Appl. No. 12/178,758 issued on Jul. 22, 2011.

Notice of Allowance of U.S. Appl. No. 12/178,758 mailed on Nov. 28, 2011.

LIGHT EMITTING DIODE HAVING WELL AND/OR BARRIER LAYERS WITH SUPERLATTICE STRUCTURE

CROSS REFERENCE TO RELATED APPLICATIONS

This application claims priority from and the benefit of Korean Patent Application No. 10-2007-0030872, filed on Mar. 29, 2007, and Korean Patent Application No. 10-2007-0032010, filed on Mar. 30, 2007, which are both hereby incorporated by reference for all purposes as if fully set forth herein.

BACKGROUND OF THE INVENTION

1. Field of the Invention

The present invention relates to a light emitting diode, and more particularly, to a light emitting diode having well and/or barrier layers with a superlattice structure.

2. Description of the Related Art

In general, since Group-III-element nitrides, such as GaN, AlN and InGaN, have an excellent thermal stability and a direct-transition-type energy band structure, they have recently come into the spotlight as materials for light emitting diodes (LEDs) in blue and ultraviolet regions. Particularly, an InGaN compound semiconductor has been considerably noticed due to its narrow band gap. LEDs using such a GaN-based compound semiconductor are used in various applications such as large-sized full-color flat panel displays, backlight sources, traffic lights, indoor illumination, high-density light sources, high-resolution output systems and optical communications. Further, LEDs emitting near ultraviolet are used in forgery identification, resin cure, ultraviolet therapy and the like, and can implement visible light with various colors through combination with phosphors.

FIG. 1 is a sectional view illustrating a conventional LED.

Referring to FIG. 1, the LED comprises an N-type semiconductor layer 17, a P-type semiconductor layer 21 and an active region 19 interposed between the N-type and P-type semiconductor layers 17 and 21. The N-type and P-type semiconductor layers include Group-III-element nitride semiconductor layers, i.e., (Al, In, Ga)N-based compound semiconductor layers. Meanwhile, the active region 19 is formed to have a single quantum well structure having a single well layer, or a multiple quantum well structure having a plurality of well layers, as shown in this figure. The active region with a multiple quantum well structure is formed by alternately laminating InGaN well layers 19a and GaN or AlGaN barrier layers 19b. The well layer 19a includes a semiconductor layer with a smaller band gap than the N-type and P-type semiconductor layers 17 and 21 and the barrier layer 19b, thereby providing quantum wells in which electrons and holes are recombined with each other.

Such a Group-III-element nitride semiconductor layer is grown on a different-type substrate 11, such as sapphire with a hexagonal system structure or SiC, using a method, such as organic chemical vapor deposition (MOCVD). However, if a Group-III-element nitride semiconductor layer is grown on the different-type substrate 11, a crack or warpage occurs in the semiconductor layer and dislocation is produced due to the difference of lattice constants and thermal expansion coefficients between the semiconductor layer and the substrate.

In order to prevent these problems, a buffer layer is formed on the substrate 11. The buffer layer generally includes a low-temperature buffer layer 13 and a high-temperature buffer layer 15. The low-temperature buffer layer 13 is generally formed of $Al_xGa_{1-x}N$ (0≤x≤1) at a temperature of 400 to 800° C. using a method, such as MOCVD. The high-temperature buffer layer 15 is then formed on the low-temperature buffer layer 13. The high-temperature buffer layer 15 is formed of a GaN layer at a temperature of 900 to 1200° C. Accordingly, crystal defects in the N-type GaN layer 17, the active region 19 and the P-type GaN layer 21 can be considerably removed.

However, although the buffer layers 13 and 15 are employed, crystal defect density in the active region 19 is still high. Particularly, in order to enhance a recombination efficiency of electrons and holes, the active region 19 includes a semiconductor layer with a smaller band gap than the N-type and P-type GaN layers 17 and 21. In addition, the well layer 19a includes a semiconductor layer with a smaller band gap than the barrier layer 19b, and generally contains a larger amount of In. Since In is relatively larger than Ga and Al, the lattice constant of a well layer is relatively greater than that of a barrier layer. Therefore, lattice mismatch occurs between the well layer 19a and the barrier layer 19b, and between the well layer 19a and the N-type semiconductor layer 17. Such lattice mismatch between the layers causes pin holes, surface roughness and the like, and degrades crystal quality of the well layer, thereby restricting the light efficiency.

SUMMARY OF THE INVENTION

An object of the present invention is to provide an LED capable of reducing occurrence of crystal defects caused by lattice mismatch between a well layer and a barrier layer in an active region.

Another object of the present invention is to provide a near-ultraviolet LED, in which occurrence of crystal defects in an active region is reduced and surface roughness of the active region is improved.

According to an aspect of the present invention for achieving the objects, there is provided a light emitting diode having a well layer with a superlattice structure. The LED according to the aspect of the present invention has an active region between an N-type GaN-based semiconductor compound layer and a P-type GaN-based semiconductor compound layer, wherein the active region comprises a well layer with a superlattice structure and a barrier layer. As the well layer with a superlattice structure is employed, it is possible to reduce occurrence of defects caused by lattice mismatch between the well layer and the barrier layer.

The well layer may have a superlattice structure formed by alternately growing InN and GaN, and the barrier layer may be formed of GaN. The composition of In within the well layer is controlled, thereby implementing light in a near-ultraviolet or visible light region.

The well layer may have a superlattice structure in which $In_xGa_{1-x}N$ and $In_yGa_{1-y}N$ are alternately laminated, where 0≤x, y<1, and x>y.

The barrier layer may also have a superlattice structure. Accordingly, it is possible to reduce occurrence of defects caused by lattice mismatch between the well layer and the barrier layer.

The barrier layer may have a superlattice structure formed by alternately growing InN and GaN. Further, the barrier layer may have a superlattice structure in which $In_uGa_{1-u}N$ and $In_vGa_{1-v}N$ are alternately laminated, where 0≤u, v≤1, and u>v.

The $In_yGa_{1-y}N$ has a bandgap relatively greater than the well layer with a superlattice structure. For example, $In_yGa_{1-y}N$ contains less In as compared with $In_xGa_{1-x}N$ in the well layer.

According to another aspect of the present invention, there is provided a near-ultraviolet LED having a barrier layer with a superlattice structure. The near-ultraviolet LED according to the other aspect of the present invention has an active region between an N-type GaN-based semiconductor compound layer and a P-type GaN-based semiconductor compound layer, wherein the active region comprises a well layer and a barrier layer with a superlattice structure, and near ultraviolet having a wavelength range of 360 to 410 nm is emitted. As the barrier layer with a superlattice structure is employed, it is possible to reduce occurrence of defects caused by lattice mismatch between the well layer and the barrier layer.

The well layer may be formed of InGaN, and the barrier layer may be formed to have a superlattice structure in which InGaN and GaN are alternately laminated. InGaN in the well layer contains a larger amount of In as compared with InGaN in the barrier layer. Accordingly, the composition of In within the well layer is controlled, thereby providing a near-ultraviolet LED emitting light with various wavelengths in a near-ultraviolet region.

Meanwhile, as InGaN in the barrier layer contains a large amount of In, the number of pin holes is reduced, but hillrocks may be produced. It is understood that this is because pin holes are filled with In to prevent them from occurring, but if In is excessively increased, hillrocks are produced by surplus In. Accordingly, the In content in InGaN of the barrier layer is appropriately selected to prevent pin holes and hillrocks from occurring.

In some embodiments, the well layer may be formed of $In_xGa_{(1-x)}N$, and the barrier layer comprises a lower superlattice having $In_yGa_{(1-y)}N$ and GaN alternately laminated; an upper superlattice having $In_yGa_{(1-y)}N$ and GaN alternately laminated; and a middle superlattice interposed between the lower and upper superlattices, the middle superlattice having $In_zGa_{(1-z)}N$ and GaN alternately laminated, where $0<x<0.5$, $0<y<0.05$, $0<z<0.1$ and $y<z<x$. According to these embodiments, a superlattice with a large In content is disposed between superlattices with a small In content. Accordingly, superlattices with different In contents are laminated, thereby preventing pin holes and hillrocks from occurring.

In another embodiments, composition ratios of InGaN in the well layer and the barrier layer with the superlattice structure may be $0<x<0.5$, $0<y<0.1$, $0<z<0.05$ and $z<y<x$. That is, unlike the aforementioned embodiments, a superlattice structure with a small In content is disposed between superlattice structures with a large In content to thereby prevent pin holes and hillrocks from occurring.

Each layer within a superlattice structure has a thickness of 30 Å or less. In these embodiments, each of $In_yGa_{(1-y)}N$, GaN and $In_zGa_{(1-z)}N$ in the barrier layer may be laminated to have a thickness of 2.5 to 20 Å. Further, the respective layers in the barrier layer may be formed to have almost the same thickness.

The lower superlattice may have $In_yGa_{(1-y)}N$ and GaN alternately laminated 4 to 10 times, the middle superlattice may have $In_zGa_{(1-z)}N$ and GaN alternately laminated 6 to 20 times, and the upper superlattice may have $In_yGa_{(1-y)}N$ and GaN alternately laminated 4 to 10 times. The number of laminated InGaN and GaN may be set such that the thickness of the barrier layer is not excessively increased and pin holes and hillrocks are prevented from occurring.

Meanwhile, the active region may be formed to have a single or multiple quantum well structure. In case of the multiple quantum well structure, the well layers and the barrier layers with a superlattice structure may be alternately laminated.

In addition, the well layers may be interposed between the barrier layers with a superlattice structure. Accordingly, it is possible to reduce strain caused by the lattice mismatch between the N-type or P-type compound semiconductor layer and the well layer.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE INVENTION

Figure 1:
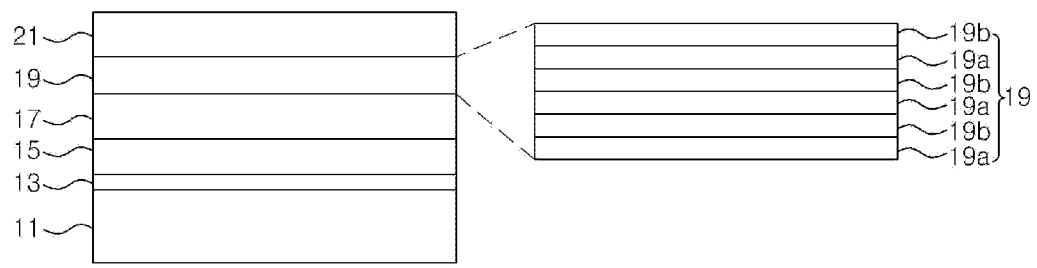
FIG. 1 is a sectional view illustrating a conventional LED.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 2:
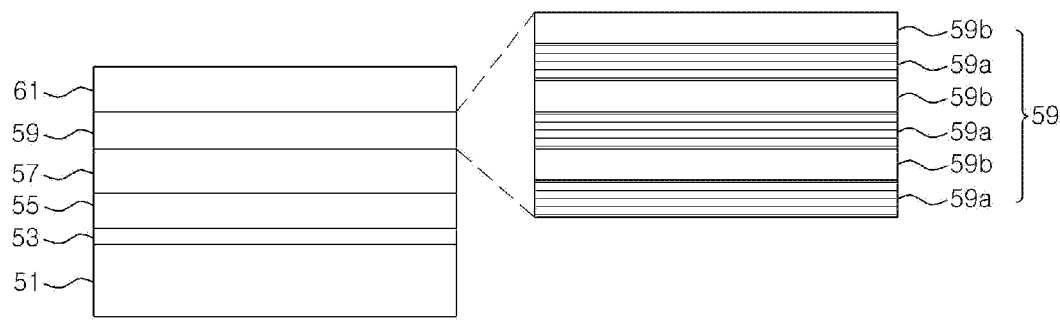
FIG. 2 is a sectional view illustrating an LED having a well layer with a superlattice structure according to an embodiment of the present invention.

FIG. 2 is a sectional view illustrating an LED according to an embodiment of the present invention.

Referring to FIG. 2, an N-type compound semiconductor layer 57 is positioned on a substrate 51. In addition, a buffer layer may be interposed between the substrate 51 and the N-type compound semiconductor layer 57. The buffer layer may include a low-temperature buffer layer 53 and a high-temperature buffer layer 55. The substrate 51 is not particularly limited, but may be, for example, a sapphire substrate, a spinel substrate, a SiC substrate, or the like. Meanwhile, the low-temperature buffer layer 53 may be generally formed of $Al_xGa_{1-x}N$ ($0 \leq x \leq 1$), and the high-temperature buffer layer 55 may be formed of, for example, undoped GaN or n-type GaN doped with n-type impurities.

A P-type compound semiconductor layer 61 is positioned on the N-type compound semiconductor layer 57, and an active region 59 is interposed between the N-type and P-type compound semiconductor layers 57 and 61. The N-type compound semiconductor layer, the active region and the P-type compound semiconductor layer include (Al, In, Ga)N-based Group-III nitride semiconductor layers. For example, the N-type and P-type compound semiconductor layers 57 and 61 may include N-type GaN and P-type GaN, or N-type AlGaN and P-type AlGaN, respectively.

Meanwhile, the active region 59 comprises well layers 59a with a superlattice structure and barrier layers 59b. The active region 59 may have a single quantum well structure having a single well layer 59a. As shown in this figure, the active region 59 may be formed to have a multiple quantum well structure in which the well layers 59a with a superlattice structure and the barrier layers 59b are alternately laminated. That is, in the active region 59 with a multiple quantum well structure, the well layers 59a with a superlattice structure and the barrier layers 59b are alternately laminated on the N-type compound semiconductor layer 57. The barrier layer 59b may be formed of GaN or AlGaN.

The well layer 59a is formed to have a superlattice structure, thereby preventing crystal defects such as dislocation and pin holes from occurring due to the lattice mismatch between the well layer and the barrier layer.

Figure 3:
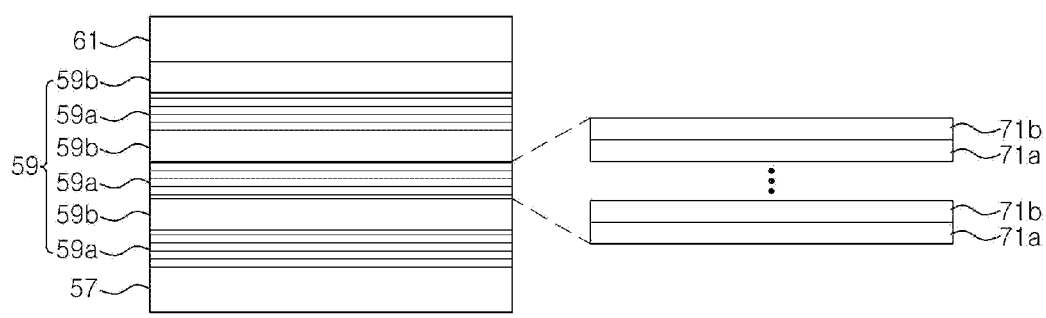
FIG. 3 is a sectional view illustrating a well layer with a superlattice structure according to embodiments of the present invention.

FIG. 3 is an enlarged sectional view of the active region in FIG. 2, illustrating a well layer with a superlattice structure according to embodiments of the present invention.

Referring to FIG. 3, the well layer 59a may have a superlattice structure formed by alternately growing InN and GaN. For example, using an MOCVD process, InN is grown by introducing In and N sources into a chamber, GaN is subsequently grown by stopping the introduction of the In source and introducing a Ga source into the chamber, and InN is then grown by stopping the introduction of the Ga source and introducing the In source into the chamber, which are repeated, thereby growing the well layer 59a with a superlattice structure.

At this time, while growing InN, the Ga source remaining in the chamber may react with the In and N sources, so that an $In_xGa_{1-x}N$ layer 71a may be formed. Further, while growing GaN, the In source remaining in the chamber may react with the Ga and N sources, so that an $In_yGa_{1-y}N$ layer 71b may be formed. Here, $0 \leq x, y \leq 1$, and $x > y$. The $In_xGa_{1-x}N$ and $In_yGa_{1-y}N$ layers 71a and 71b may be repeatedly formed, for example, in a thickness of 2.5 to 20 Å at 800 to 900° C. using an MOCVD method, and the composition of In in the $In_xGa_{1-x}N$ layer 71a is controlled, thereby implementing light in a near-ultraviolet or visible light region.

In these embodiments, the well layer 59a is formed to have a superlattice structure, thereby preventing crystal defects from occurring due to the lattice mismatch between the well layer 59a and the barrier layer 59b.

Meanwhile, although it is illustrated in this embodiment that the well layer 59a is first formed on the N-type semiconductor layer 57, the barrier layer 59b may be first formed on the N-type semiconductor layer 57, and then, the well layer 59a may be formed on the barrier layer 59b. Further, although it is illustrated that the $In_xGa_{1-x}N$ layer 71a is first formed and the $In_yGa_{1-y}N$ layer 71b is then formed, the order thereof may be changed.

Figure 4:
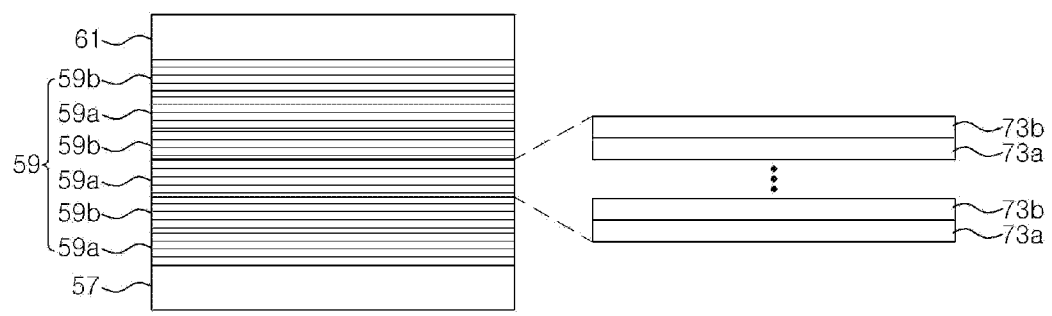
FIG. 4 is a sectional view illustrating an LED according to another embodiment of the present invention.

FIG. 4 is a sectional view illustrating an LED according to another embodiment of the present invention.

Referring to FIG. 4, a buffer layer, an N-type compound semiconductor layer 57 and a P-type compound semiconductor layer 61 are positioned on a substrate, and an active region 59 is interposed between the N-type and P-type compound semiconductor layers 57 and 61, as described with reference to FIGS. 2 and 3. The active region 59 comprises well layers 59a with a superlattice structure and barrier layers 59b. However, in this embodiment, the barrier layers 59b also have a superlattice structure.

The barrier layer 59b may have a superlattice structure formed by alternately growing InN and GaN as described with reference to FIG. 3. For example, using an MOCVD process, InN is grown by introducing In and N sources into a chamber, GaN is subsequently grown by stopping the introduction of the In source and introducing a Ga source into the chamber, and InN is then grown by stopping the introduction of the Ga source and introducing the In source into the chamber, which are repeated, thereby growing the barrier layer 59b with a superlattice structure.

At this time, while growing InN, the Ga source remaining in the chamber reacts with the In and N sources, so that an $In_uGa_{1-u}N$ layer 73a may be formed. Further, while growing GaN, the In source remaining in the chamber reacts with the Ga and N sources, so that an $In_vGa_{1-v}N$ layer 73b may be formed. Here, $0 \leq u, v \leq 1$, and $u > v$. The $In_uGa_{1-u}N$ and $In_vGa_{1-v}N$ layers 73a and 73b may be repeatedly formed, for example, in a thickness of 2.5 to 20 Å at 800 to 900° C. using an MOCVD method.

Meanwhile, the barrier layer 59b has a bandgap broader than the well layer 59a. Generally, as the In composition ratio within an InGaN layer decreases, the bandgap of the InGaN layer increases. Thus, the $In_vGa_{1-v}N$ layer 73b is grown so that the In composition ratio "v" of the $In_vGa_{1-v}N$ layer 73b has a value relatively smaller than the In composition ratio "x" of the $In_xGa_{1-x}N$ layer 71a (see FIG. 3).

In this embodiment, the barrier layer 59b is formed to have a superlattice structure, thereby preventing crystal defects from occurring due to the lattice mismatch between the well layer 59a and the barrier layer 59b.

Meanwhile, although it is illustrated and described in this embodiment that the $In_uGa_{1-u}N$ layer 73a is first formed and the $In_vGa_{1-v}N$ layer 73b is then formed, the order thereof may be changed.

In addition, according to embodiments of the present invention, the positions of the N-type and P-type compound semiconductor layers 57 and 61 may be changed with each other.

Figure 5:
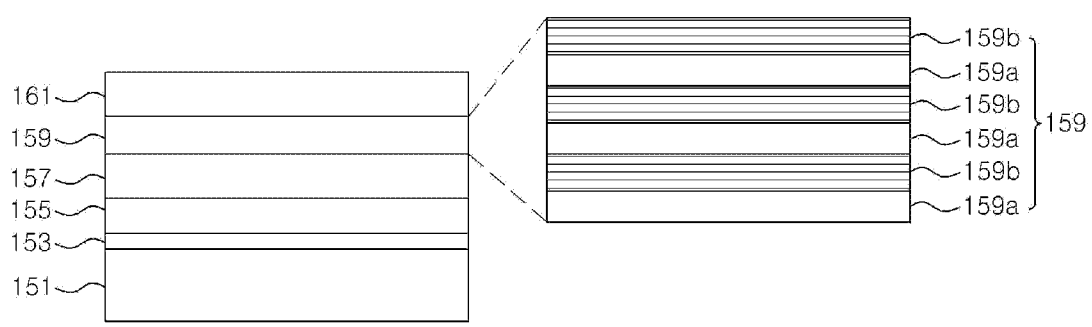
FIG. 5 is a sectional view illustrating a near-ultraviolet LED having a barrier layer with a superlattice structure according to a further embodiment of the present invention.

FIG. 5 is a sectional view illustrating a near-ultraviolet LED according to a further embodiment of the present invention.

Referring to FIG. 5, an N-type compound semiconductor layer 157 is positioned on a substrate 151, a buffer layer may be interposed between the substrate 151 and the N-type compound semiconductor layer 157 as described with reference to FIG. 2. The buffer layer comprises a low-temperature buffer layer 153 and a high-temperature buffer layer 155. In addition, a P-type compound semiconductor layer 161 is positioned on the N-type compound semiconductor layer 157, and an active region 159 is interposed between the N-type and P-type compound semiconductor layers 157 and 161. The N-type and P-type compound semiconductor layers may include (Al, In, Ga)N-based Group-III nitride semiconductor layers. For example, the N-type and P-type compound semiconductor layers 157 and 161 may include N-type GaN and P-type GaN, or N-type AlGaN and P-type AlGaN, respectively.

Meanwhile, the active region 159 comprises well layers 159a and barrier layers 159b with a superlattice structure. The active region 159 may have a single quantum well structure having a single well layer 159a. At this time, the barrier layer 159b with a superlattice structure is positioned on the upper and/or lower portion of the well layer 159a. As shown in this figure, the active region 159 may be formed to have a multiple quantum well structure in which the well layers 159a and the barrier layers 159b with a superlattice structure are alternately laminated. That is, the InGaN well layers 159a and the barrier layers 159b are alternately laminated on the N-type compound semiconductor layer 157, and the barrier layer 159b has a superlattice structure in which InGaN and GaN are alternately laminated. In InGaN of the well layer 159a, an In content is selected so that light having a wavelength range of 360 to 410 nm is emitted, and quantum wells are formed so that more In is contained as compared with InGaN within the barrier layer 159b.

The barrier layer 159b is formed to have a superlattice structure, thereby preventing crystal defects such as dislocation and pin holes from occurring due to the lattice mismatch between the well layer and the barrier layer. In addition, the barrier layer 159b is formed to have an InGaN/GaN superlattice structure, thereby reducing the lattice mismatch that occurs between the conventional InGaN well layer and AlGaN barrier layer. Meanwhile, if the In content of InGaN in the barrier layer 159b is increased, it is possible to prevent pin holes from being produced, but hillrocks occur. It is understood that this is because the hillrocks are formed due to surplus In remaining on an InGaN layer. Accordingly, pin holes and hillrocks can be prevented from occurring by appropriately controlling the In content in the barrier layer 159b, and the composition ratio of In can be adjusted in a range of 0.01 to 0.1.

Meanwhile, in some embodiments of the present invention, a barrier layer with a superlattice structure for preventing pin holes and hillrocks from occurring may include InGaNs having different In contents. This will be described in detail below.

Figure 6:
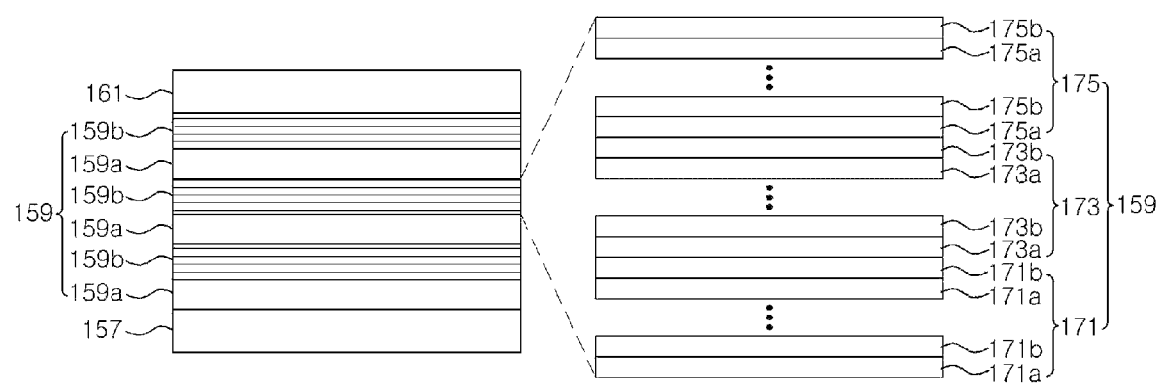
FIG. 6 is a sectional view illustrating the barrier layer with the superlattice structure according to the further embodiment of the present invention.

FIG. 6 is an enlarged sectional view of the active region in FIG. 5 for illustrating a barrier layer with a superlattice structure including InGaNs with different In contents according to an embodiment of the present invention.

Referring to FIG. 6, the well layer 159a may be expressed by $In_xGa_{(1-x)}N$, where $0<x<0.5$. The In content is selected so that near ultraviolet having a wavelength range of 360 to 410 nm is emitted. Meanwhile, the barrier layer 159b with a superlattice structure comprises a lower superlattice 171 having $In_yGa_{(1-y)}N$ layers 171a and GaN layers 171b alternately laminated, an upper superlattice 175 having $In_yGa_{(1-y)}N$ layers 175a and GaN layers 175b alternately laminated, and a middle superlattice 173 interposed between the lower and upper superlattices 171 and 175. The middle superlattice 173 is formed by alternately laminating $In_zGa_{(1-z)}N$ layers 173a and GaN layers 173b. Here, $0<x<0.5$, $0<y<0.05$, $0<z<0.1$ and $y<z<x$.

The $In_yGa_{(1-y)}N$ layer 171a or 175a in each of the lower and upper superlattices has a smaller In content than the $In_zGa_{(1-z)}N$ layer 173a in the middle superlattice. Hence, fine pin holes may be formed in a process of forming the lower superlattice 171. However, the middle superlattice 173 formed thereafter contains surplus In, thus filling the pin holes with the surplus In to thereby remove the pin holes. Meanwhile, the surplus In in the middle superlattice 173 may generate hillrocks. Such surplus In is removed by the upper superlattice 175. According to this embodiment, pin holes and hillrocks can be prevented from occurring by employing a superlattice structure containing InGaNs with a small In content and a superlattice structure containing InGaN with a great In content.

InGaN and GaN in each of the lower, middle and upper superlattices 171, 173 and 175 are alternately laminated. A pair of InGaN and GaN may be repeatedly laminated 4 to 10 times in the lower superlattice 171, 6 to 20 times in the middle superlattice 173 and 4 to 10 times in the upper superlattice 175. The number of laminated InGaN and GaN may be varied depending on thicknesses of InGaN and GaN and the In content in InGaN, and is set to control the occurrence of pin holes and hillrocks.

Although it has been described in this embodiment that the InGaN layer in the lower and upper superlattices 171 and 175 has a smaller In content than the InGaN layer in the middle superlattice 73, the InGaN layer in the lower and upper superlattices 171 and 175 may have a greater In content than the InGaN layer in the middle superlattice 173. That is, In composition ratios in the well layer and the barrier layer may satisfy $0<x<0.5$, $0<y<0.1$, $0<z<0.05$ and $z<y<x$.

InGaN and GaN in each of the lower, middle and upper superlattices 171, 173 and 175 may be formed at a temperature of 800 to 900° C. using an MOCVD method. Each of InGaN and GaN in the barrier layer 159b may be laminated to have a thickness of 2.5 to 20 Å, and they may be formed to have almost the same thickness.

Figure 7:
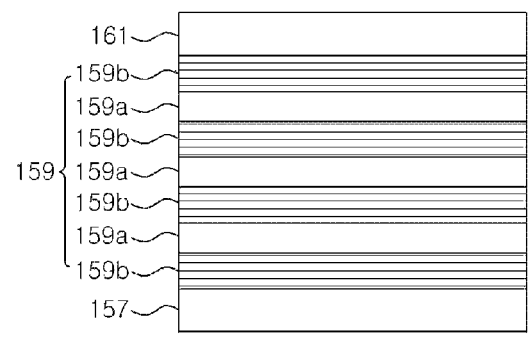
FIG. 7 is a sectional view illustrating a near-ultraviolet LED having a barrier layer with a superlattice structure according to a still further embodiment of the present invention.

Meanwhile, although it has been shown in FIG. 6 that the N-type compound semiconductor layer 157 and the well layer 159a are in contact with each other, the barrier layer 159b with a superlattice structure as described with reference to FIG. 6 may be interposed between the N-type compound semiconductor layer 157 and the well layer 159a as shown in FIG. 7. The barrier layer 159b interposed between the N-type compound semiconductor layer 157 and the well layer 159a reduces strain caused by the lattice mismatch between the N-type compound semiconductor layer 157 and the well layer 159a, thereby preventing crystal defects from occurring in the well layer 159a.

In the embodiments of the present invention, the positions of the N-type and P-type compound semiconductor layers 157 and 161 may be changed with each other.

According to embodiments of the present invention, there is provided an LED, wherein well and/or barrier layers with a superlattice structure are employed, so that occurrence of crystal defects such as dislocation and pin holes due to lattice mismatch in an active region can be reduced, and surface roughness can be improved, thereby enhancing light efficiency. Further, there is provided a near-ultraviolet LED, wherein lattice mismatch between barrier and well layers can be reduced by employing a barrier layer with a superlattice structure in which InGaN and GaN are alternately laminated.

What is claimed is:

1. A light emitting diode (LED) comprising:
an N-type GaN-based semiconductor compound layer;
a P-type GaN-based semiconductor compound layer; and
an active region disposed between the P-type and N-type layers, the active region comprising alternately laminated well layers having a first superlattice structure and barrier layers,
wherein:
each of the well layers comprises alternately laminated $In_xGa_{1-x}N$ layers and $In_yGa_{1-y}N$ layers, where $0\leq x$, $y\leq 1$, and $x>y$;
the well layers and the barrier layers comprise three different compositions; and
the barrier layers have a second superlattice structure and are formed by alternately growing InN and GaN.

2. A light emitting diode (LED) comprising:
an N-type GaN-based semiconductor compound layer;
a P-type GaN-based semiconductor compound layer; and
an active region disposed between the P-type and N-type layers, the active region comprising alternately laminated well layers having a first superlattice structure and barrier layers, wherein:

each of the well layers comprises alternately laminated $In_xGa_{1-x}N$ layers and $In_yGa_{1-y}N$ layers, where $0 \leq x, y \leq 1$, and $x > y$;

the well layers and the barrier layers comprise three different compositions; and the barrier layers have a second superlattice structure and comprise $In_uGa_{1-u}N$ and $In_vGa_{1-v}N$ layers that are alternately laminated, where $0 \leq u, v \leq 1$, $u > v$, and $v < x$.

3. A light emitting diode (LED) comprising:

an N-type GaN-based semiconductor compound layer;

a P-type GaN-based semiconductor compound layer; and an active region disposed between the P-type and N-type layers, the active region comprising alternately laminated well layers having a first superlattice structure and barrier layers, wherein:

each of the well layers comprises alternately laminated $In_xGa_{1-x}N$ layers and $In_yGa_{1-y}N$ layers, where $0 \leq x, y \leq 1$, and $x > y$;

the well layers and the barrier layers comprise three different compositions;

the barrier layers comprise alternately laminated $In_uGa_{1-u}N$ and $In_vGa_{1-v}N$ layers, where $0 \leq u, v \leq 1$, and $u > v$; and $In_vGa_{1-v}N$ has a band gap relatively greater than that of the well layers.

* * * * *